(12) United States Patent
Peng et al.

(10) Patent No.: US 7,701,723 B2
(45) Date of Patent: Apr. 20, 2010

(54) PROTECTING APPARATUS OF CHIP

(75) Inventors: Wen-Tang Peng, Tu-Cheng (TW);
Hung-Yi Wu, Tu-Cheng (TW);
Guang-Yi Zhang, Shenzhen (CN);
Jiang-Ping Zhu, Shenzhen (CN);
Ming-Ke Chen, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 849 days.

(21) Appl. No.: 11/309,229

(22) Filed: Jul. 14, 2006

(65) Prior Publication Data

US 2007/0194444 A1    Aug. 23, 2007

(30) Foreign Application Priority Data

Feb. 18, 2006   (CN) .......................... 2006 2 0055228

(51) Int. Cl.
*H05K 7/10* (2006.01)
(52) U.S. Cl. .................. 361/752; 361/740; 361/747
(58) Field of Classification Search ......... 361/807–810, 361/732, 740, 747, 752, 756, 759, 741
See application file for complete search history.

(56) References Cited

U.S. PATENT DOCUMENTS

| 4,744,009 | A | * | 5/1988 | Grabbe et al. ............... 361/749 |
| 4,801,035 | A | | 1/1989 | Sugiyama et al. |
| 5,176,524 | A | * | 1/1993 | Mizuno et al. ............... 439/68 |
| 5,322,446 | A | * | 6/1994 | Cearley-Cabbiness ....... 439/73 |
| 5,469,074 | A | * | 11/1995 | Drabenstadt et al. ........ 324/758 |
| 5,820,391 | A | * | 10/1998 | Delprete et al. ............... 439/91 |
| 6,159,030 | A | * | 12/2000 | Gawron et al. ............. 439/247 |
| 6,162,066 | A | * | 12/2000 | Glick et al. .................... 439/73 |
| 6,356,456 | B2 | * | 3/2002 | Eskildsen ................... 361/801 |
| 7,417,866 | B1 | * | 8/2008 | Beseth et al. ............... 361/732 |

\* cited by examiner

*Primary Examiner*—Dameon E Levi
(74) *Attorney, Agent, or Firm*—Wei Te Chung

(57) ABSTRACT

A protecting apparatus is provided for protecting a chip that is mounted on a subminiature circuit board. The protecting apparatus includes a supporting seat for mounting the subminiature circuit board thereon, and a protective cover for receiving the subminiature circuit board and the supporting seat therein. The supporting seat includes a locking element. The protective cover includes a connecting element corresponding to the locking element. The supporting seat is fixed in the protective cover via the locking element engaging with the connecting element.

20 Claims, 6 Drawing Sheets

PROTECTING APPARATUS OF CHIP

FIELD OF THE INVENTION

The present invention relates to protecting apparatuses, and particularly to a protecting apparatus for protecting a chip which is mounted on a subminiature circuit board.

DESCRIPTION OF RELATED ART

Generally speaking, a circuit board connects with some chips, and most of those chips are usually directly connected to the circuit board. However, for saving some space of the circuit board or other reasons, a chip may be mounted on a subminiature circuit board, and then the subminiature circuit board connected to the circuit board through a connector of the subminiature circuit board.

FIG. 1 shows a conventional subminiature circuit board 100. A chip 200 is mounted on the subminiature circuit board 100. The subminiature circuit board 100 includes a connector 120. Pins of the connector 120 are electrically connected to pins of the chip 200 correspondingly. A circuit board (not shown), which connects with the chip 200, includes a connector corresponding to the connector 120. After making the connector of the circuit board connect to the connector 120, the chip 200 can communicate with the circuit board. However, the chip 200 is exposed on the subminiature circuit board 100. The chip 200 may be damaged during assembly of the subminiature circuit board 100 or other components to the circuit board.

What is desired, therefore, is to provide a protecting apparatus for protecting a chip which is mounted on a subminiature circuit board.

SUMMARY OF THE INVENTION

In one preferred embodiment, a protecting apparatus is provided for protecting a chip that is mounted on a subminiature circuit board. The protecting apparatus includes a supporting seat for mounting the subminiature circuit board thereon, and a protective cover for receiving the subminiature circuit board and the supporting seat therein. The supporting seat includes a locking element. The protective cover includes a connecting element corresponding to the locking element. The supporting seat is fixed in the protective cover via the locking element engaging with the connecting element.

Other advantages and novel features will become more apparent from the following detailed description when taken in conjunction with the accompanying drawings, in which:

DETAILED DESCRIPTION OF THE INVENTION

Figure 1:
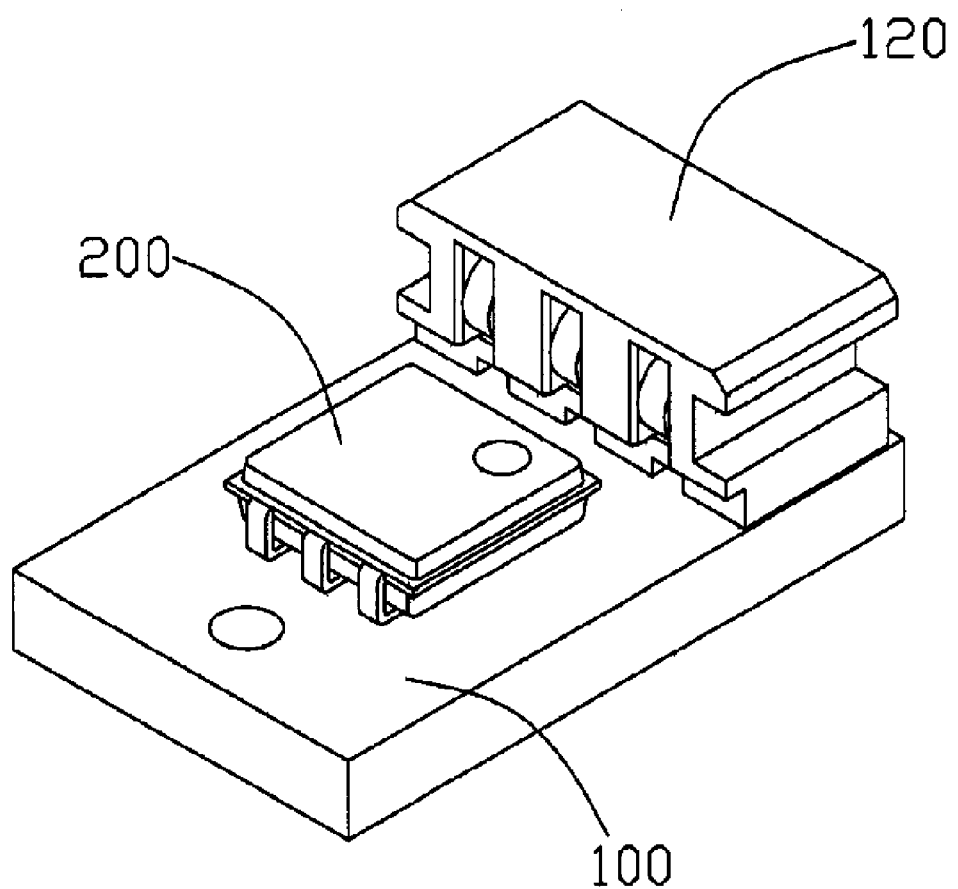
FIG. 1 is an isometric view of a conventional subminiature circuit board with a chip mounted thereon.
Figure 2:
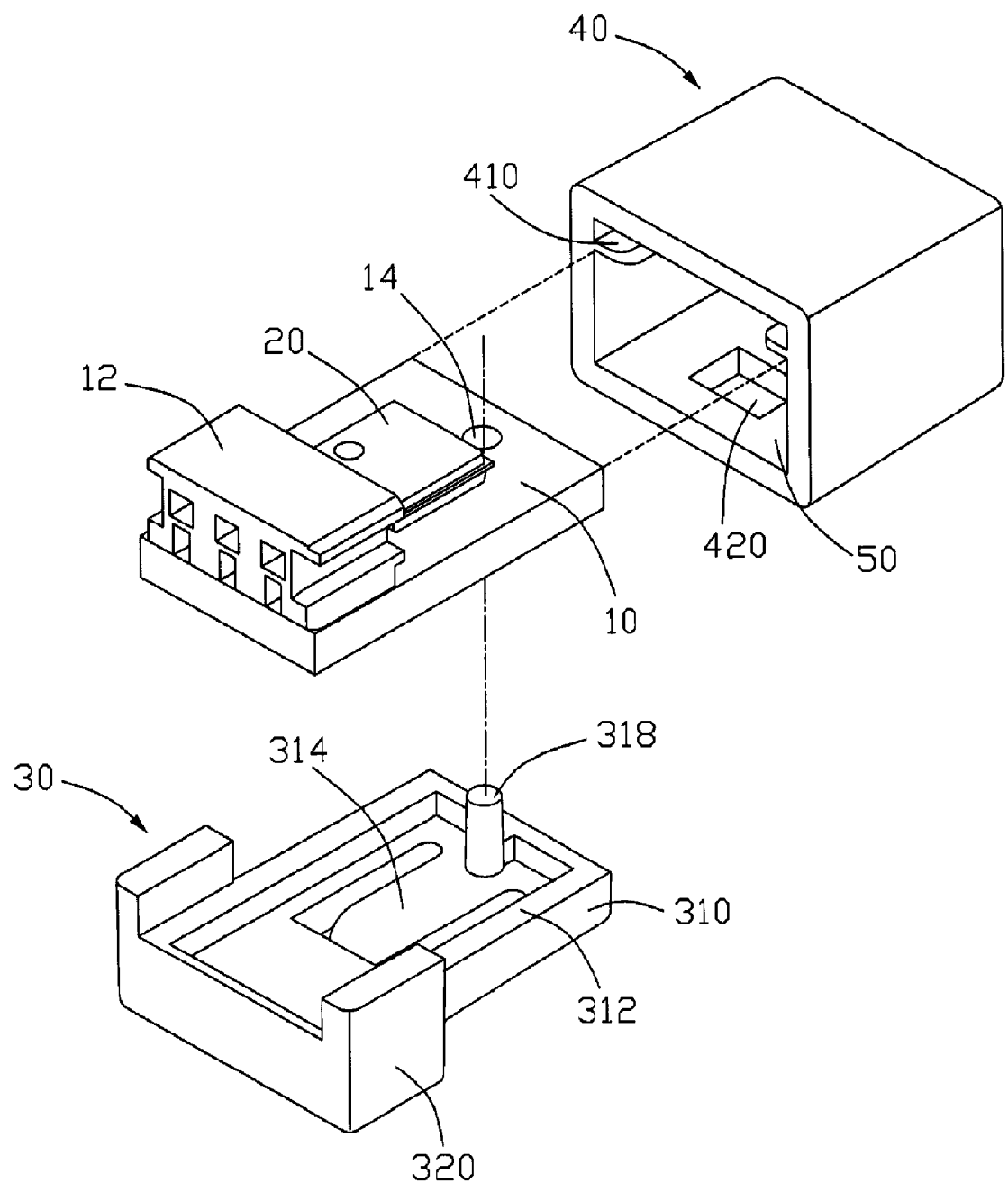
FIG. 2 is an exploded, isometric view of a protecting apparatus in accordance with a preferred embodiment of the present invention, together with a subminiature circuit board and a chip.
Figure 3:
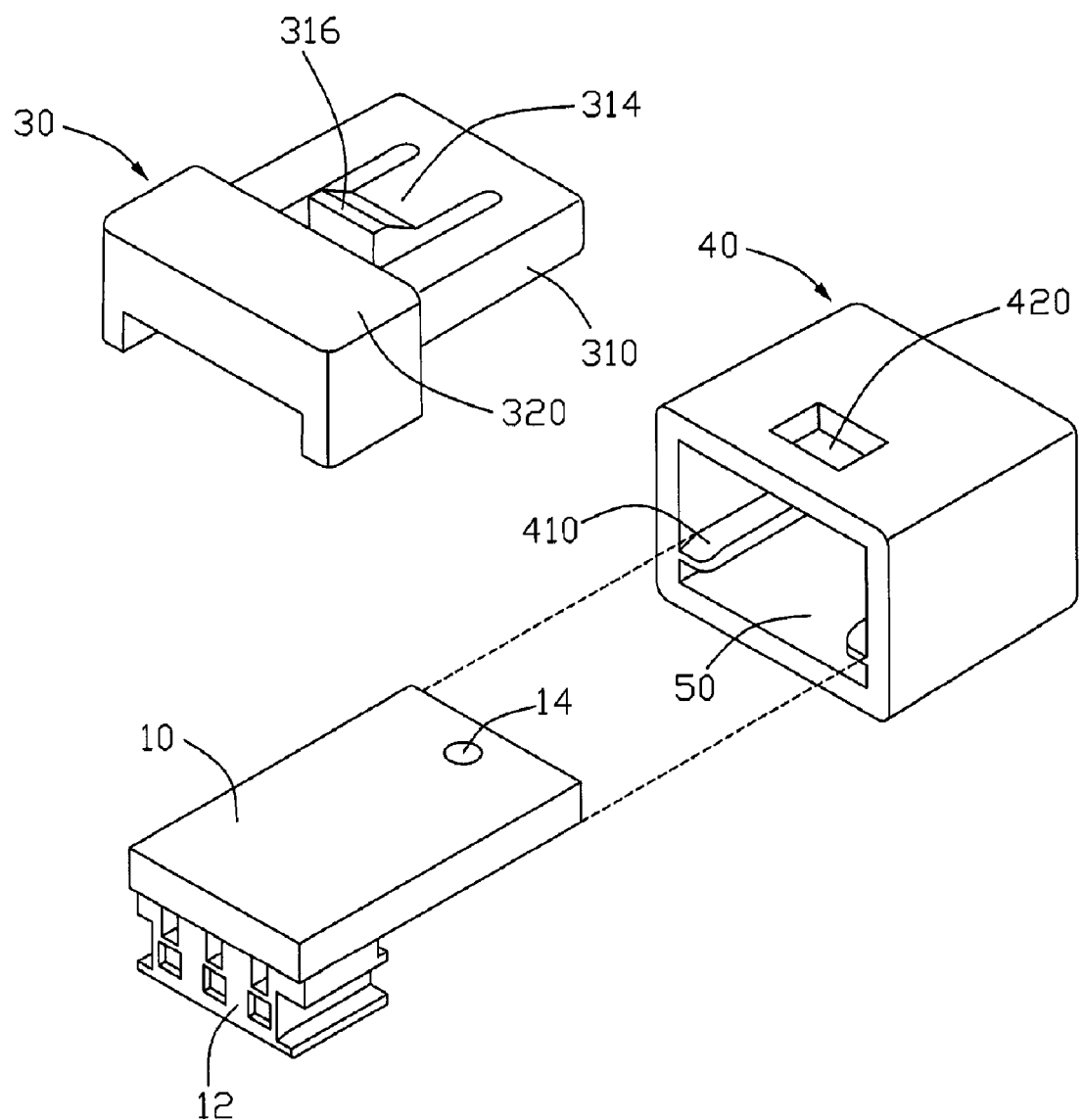
FIG. 3 is similar to FIG. 2, but viewed from another aspect.

Referring to FIGS. 2 and 3, a protecting apparatus in accordance with a preferred embodiment of the present invention is provided to protect an electronic component like a chip 20 that is mounted on a circuit part like a subminiature circuit board 10. The protecting apparatus includes a supporting seat 30 for mounting the subminiature circuit board 10 thereon, and a protective cover 40 for receiving the subminiature circuit board 10 and the supporting seat 30 therein.

In this embodiment, the subminiature circuit board 10 includes a connector 12 and a through hole 14. Pins of the connector 12 are electrically connected to corresponding pins of the chip 20. The chip 20 communicates with an electric device (not shown), such as a motherboard of a computer, via the connector 12 connecting to a corresponding connector of the electric device.

The supporting seat 30 includes a main portion 310 whose size is approximately the same as the subminiature circuit board 10, and a U-shaped receiving portion 320 at an end of the main portion 310 for receiving a connector end of the subminiature circuit board 10. A supporting platform 312 is upwardly formed from four edges of the main portion 310 for supporting the subminiature circuit board 10. A positioning element such as a positioning post 318 is formed perpendicular to, and up from the main portion 310 corresponding to the though hole 14 for positioning the subminiature circuit board 10 on the supporting platform 312. The main portion 310 further includes a locking element such as a resilient cantilever 314 with a wedged hook 316 extended from a distal end thereof, which is formed from a middle of the main portion 310.

The protective cover 40 forms a receiving space 50. A blocking element such as two bars 410 are respectively formed from inner surfaces of two opposite side walls of the protective cover 40. The receiving space 50 is thereby divided into an upper receiving space and a lower receiving space by the bars 410. A height of the upper receiving space is greater than a thickness of the chip 20. A height of the lower receiving space is not less than a sum of a thickness of the subminiature circuit board 10 and a thickness of the supporting platform 312. A depth of the receiving space 50 is not less than a length of the supporting seat 30 not including the receiving portion 320. A connecting element such as locking hole 420 is defined in a bottom of the protective cover 40 corresponding to the wedged hook 316 of the resilient cantilever 314 of the main portion 310. The supporting seat 30 is fixed in the protective cover 40 via the wedged hook 316 engaging with the locking hole 420.

Figure 4:
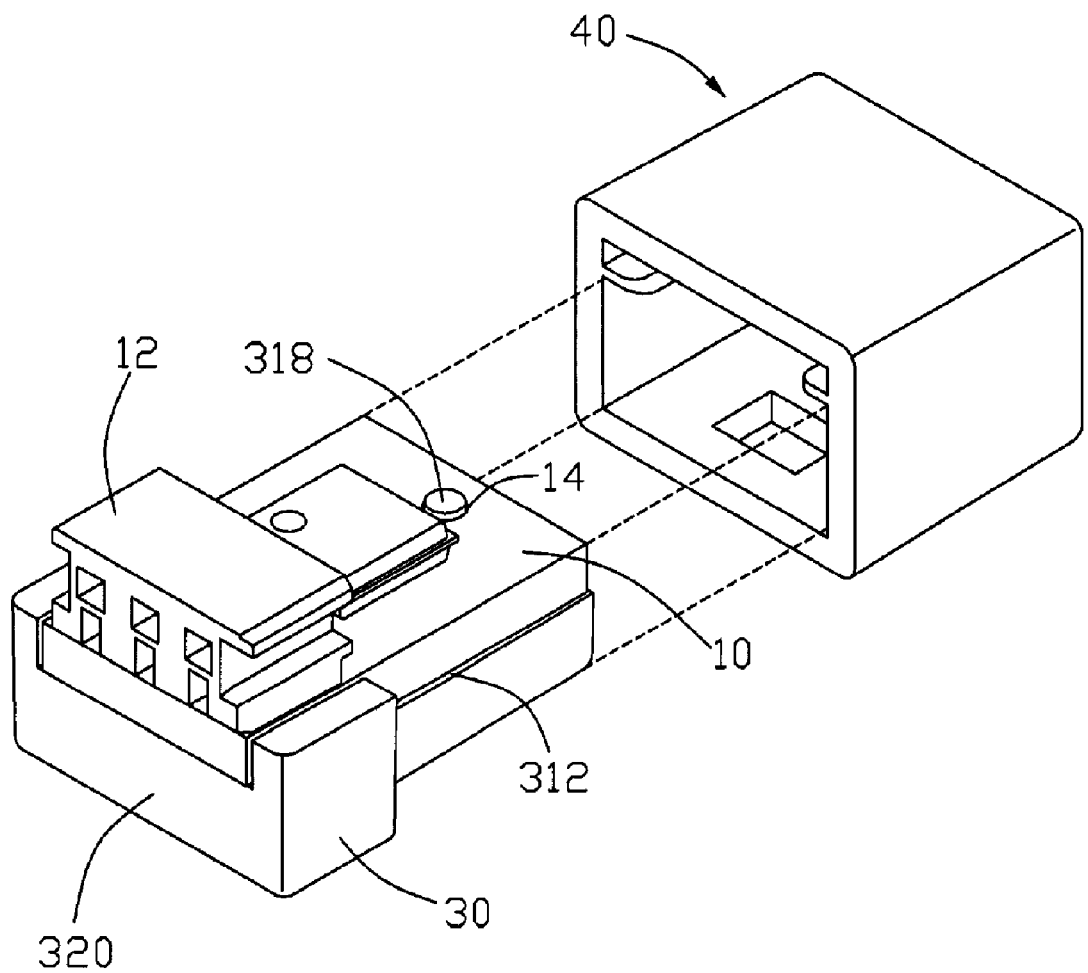
FIG. 4 is a partial assembled view of FIG. 2, showing an assembling process.
Figure 5:
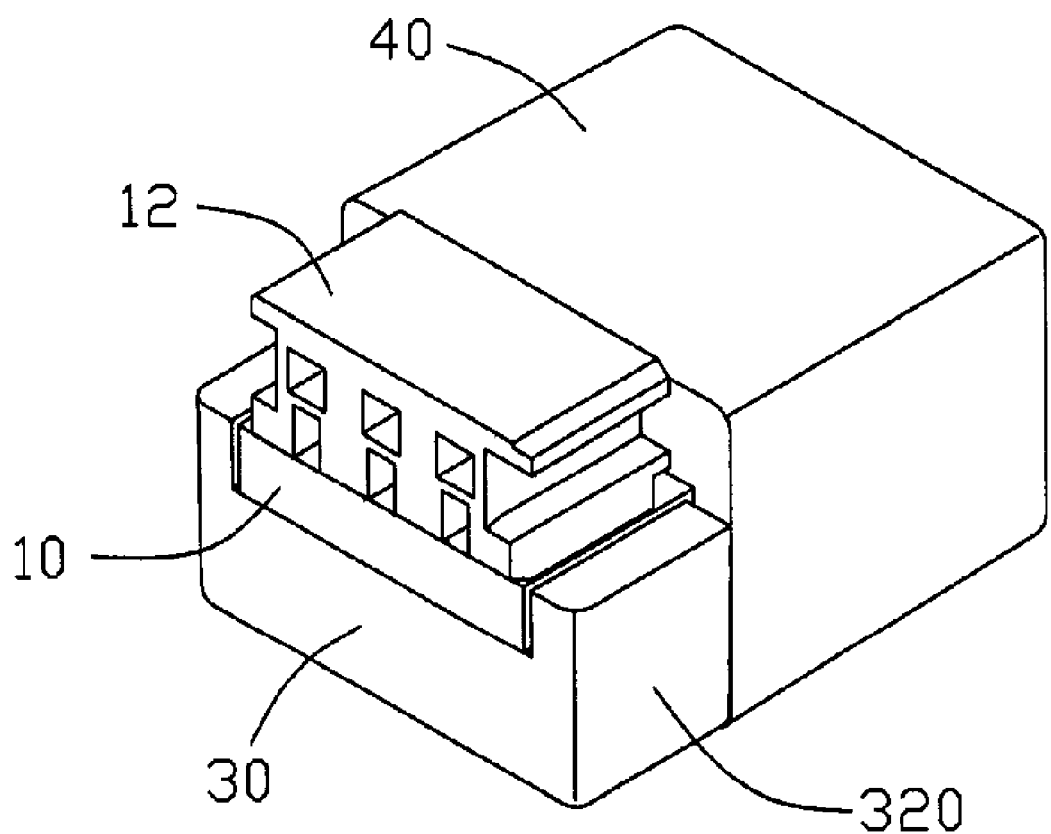
FIG. 5 is an assembled view of FIG. 2.
Figure 6:
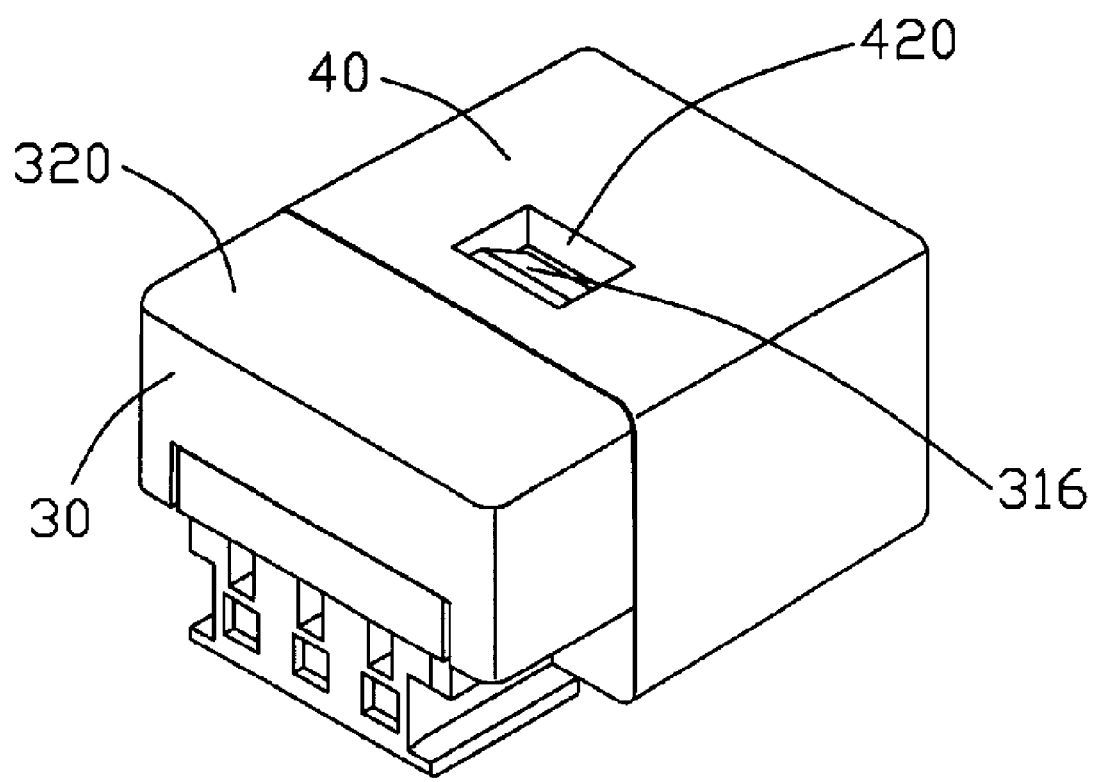
FIG. 6 is similar to FIG. 5, but viewed from another aspect.

Referring also to FIGS. 4-6, in assembly, the positioning post 318 of the supporting seat 30 enters the through hole 14 of the subminiature circuit board 10. The connector end of the subminiature circuit board 10 is received in the receiving portion 320. Thereby, the subminiature circuit board 10 is positioned on the supporting seat 30.

Then, the subminiature circuit board 10 and the supporting seat 30 is pushed into the lower receiving space along the bars 410, and the connector 12 is set outside of the protective cover 40. Because the bars 410 prevent the subminiature circuit board 10 from moving up when sliding into the receiving space 50, and the height of the upper receiving space is greater than the thickness of the chip 20, the chip 20 will not touch a top wall of the protective cover 40 during assembly.

After the subminiature circuit board 10 and the supporting seat 30 is received into the receiving space 50. The wedged hook 316 of the resilient cantilever 314 is resiliently engaged into the locking hole 420, thereby fixing the supporting seat 30 in the protective cover 40.

In disassembly, the wedged hook 316 of the resilient cantilever 314 is pressed up, so that the wedged hook 316 is withdrawn from the locking hole 420. Thus, the supporting seat 30 can be pulled out from the protective cover 40, and then the subminiature circuit board 10 is taken out from the supporting seat 30. Therefore, using the supporting seat 30 and the protective cover 40 effectively protects the chip 20 from physical damage.

It is believed that the present embodiment and its advantages will be understood from the foregoing description, and it will be apparent that various changes may be made thereto without departing from the spirit and scope of the invention or sacrificing all of its material advantages, the example hereinbefore described merely being a preferred or exemplary embodiment of the invention.

What is claimed is:

1. A protecting apparatus for protecting a chip that is mounted on a subminiature circuit board comprising a connector electrically connected to the chip, the protecting apparatus comprising:

a supporting seat for mounting the subminiature circuit board thereon, the supporting seat comprising a locking element; and a cuboid protective cover comprising a bottom, two opposite sidewalls extending up from the bottom, and a top connecting the sidewalls to define a receiving space thereamong, the subminiature circuit board and the supporting seat slidable into the receiving space through an opening confined by edges of the bottom, the top and the two sidewalls of the protective cover, the protective cover comprising a connecting element corresponding to the locking element, wherein the supporting seat is inserted into the receiving space of the protective cover and fixed in the protective cover via the locking element engaging with the connecting element.

2. The protecting apparatus as claimed in claim 1, wherein the supporting seat comprises a supporting platform that is upwardly formed from four edges of the supporting seat.

3. The protecting apparatus as claimed in claim 1, wherein the supporting seat further comprises a U-shaped receiving portion at an end of the supporting seat for receiving a connector end of the subminiature circuit board.

4. The protecting apparatus as claimed in claim 1, wherein the supporting seat further comprises a positioning element for positioning the subminiature circuit board on the supporting seat.

5. The protecting apparatus as claimed in claim 4, wherein the positioning element comprises a positioning post that is formed perpendicularly to and up from the supporting seat for being inserted into a through hole of the subminiature circuit board.

6. The protecting apparatus as claimed in claim 1, wherein the locking element comprises a resilient cantilever with a wedged hook extended from a distal end thereof, the connecting element comprises a locking hole, and the wedged hook is engaged into the locking hole.

7. The protecting apparatus as claimed in claim 6, wherein the resilient cantilever is formed from a middle of the supporting seat, and the locking hole is defined in the bottom of the protective cover.

8. The protecting apparatus as claimed in claim 1, wherein a blocking element is formed in from one of the sidewalls of the protective cover to abut against the subminiature circuit board thereby protecting the chip from touching the top of the protective cover.

9. The protecting apparatus as claimed in claim 8, wherein the blocking element comprises two bars that are respectively formed from inner surfaces of the two opposite side walls of the protective cover.

10. An assembly comprising:
a subminiature circuit board comprising a connector;
a chip mounted on the subminiature circuit board, pins of the chip electrically connected to pins of the connector;
a supporting seat comprising a locking element; and
a cuboid protective cover comprising a bottom, two opposite sidewalls extending up from the bottom, and a top connecting the sidewalls to define a receiving space thereamong therein and comprising a connecting element corresponding to the locking element, wherein the subminiature circuit board is mounted on the supporting seat, the subminiature circuit board and the supporting seat is inserted into the receiving space of the protective cover, and the supporting seat is fixed in the protective cover via the locking element engaging with the connecting element.

11. The assembly as claimed in claim 10, wherein the supporting seat comprises a supporting platform that is formed up from four edges of the supporting seat.

12. The assembly as claimed in claim 10, wherein the supporting seat further comprises a U-shaped receiving portion at an end of the supporting seat for receiving the connector of the subminiature circuit board.

13. The assembly as claimed in claim 10, wherein the supporting seat further comprises a positioning element for positioning the subminiature circuit board on the supporting seat.

14. The assembly as claimed in claim 13, wherein the positioning element comprises a positioning post that is formed perpendicular to and up from the supporting seat for being inserted into a through hole of the subminiature circuit board.

15. The assembly as claimed in claim 10, wherein the locking element comprises a resilient cantilever with a wedged hook extended from a distal end thereof, the connecting element comprises a locking hole, and the wedged hook is engaged into the locking hole.

16. The assembly as claimed in claim 15, wherein the resilient cantilever is formed from a middle of the supporting seat, and the locking hole is defined in the bottom of the protective cover.

17. The assembly as claimed in claim 10, wherein a blocking element is formed in from one of the sidewalls of the protective cover to abut against the subminiature circuit board thereby protecting the chip from touching the top of the protective cover.

18. The assembly as claimed in claim 17, wherein the blocking element comprises two bars that are respectively formed from inner surfaces of two opposite side walls of the protective cover.

19. An assembly comprising:
a circuit part of said assembly;
an electronic component electrically attachable to said circuit part so as to be electrical-signal-communicable with another electronic device via said circuit part; and
a protecting apparatus comprising a bottom, two opposite sidewalls extending up from the bottom, and a top connecting the sidewalls to define a receiving space thereamong for enclosing said circuit part and said attached electronic component in said receiving space so as to completely block access to said electronic component, a blocking element extending from said protecting apparatus into said receiving space to define said receiving space separably with a first space and a second space, said circuit part being confinable in said first space by said blocking element and said protective apparatus to allow said electronic component able to be untouchably receivable in said second space.

20. The assembly as claimed in claim 19, wherein said protective apparatus comprises a supporting seat and a protective cover connectively engagable with each other to form said protective apparatus, said blocking element is formed in said protective cover to define said second space therein.

* * * * *